United States Patent [19]
Piper et al.

[11] Patent Number: 5,953,590
[45] Date of Patent: Sep. 14, 1999

[54] METHOD AND APPARATUS TO HOLD INTEGRATED CIRCUIT CHIPS ONTO A CHUCK AND TO SIMULTANEOUSLY REMOVE MULTIPLE INTEGRATED CIRCUIT CHIPS FROM A CUTTING CHUCK

[75] Inventors: John G. Piper, Midvale; Chris Keith, Caldwell, both of Id.

[73] Assignee: Micron Technology, Inc., Boise, Id.

[21] Appl. No.: 08/990,165

[22] Filed: Dec. 12, 1997

Related U.S. Application Data

[62] Division of application No. 08/756,981, Nov. 26, 1996, Pat. No. 5,803,797.

[51] Int. Cl.⁶ .................................................. H01L 21/44
[52] U.S. Cl. ........................... 438/113; 438/460; 438/462
[58] Field of Search ...................... 438/113, 460, 438/461, 462, 463, 464, 465

[56] References Cited

U.S. PATENT DOCUMENTS

| | | |
|---|---|---|
| 3,004,766 | 10/1961 | Bryant . |
| 3,690,780 | 9/1972 | Bjelland et al. . |
| 3,809,050 | 5/1974 | Chough et al. . |
| 3,811,182 | 5/1974 | Ryan, Sr. et al. . |
| 3,976,288 | 8/1976 | Cuomo, Jr. . |
| 4,138,304 | 2/1979 | Gantley . |
| 4,521,995 | 6/1985 | Sekiya . |
| 4,597,228 | 7/1986 | Koyama et al. . |
| 4,625,463 | 12/1986 | Sekiya . |
| 4,808,046 | 2/1989 | Pilkington et al. . |
| 5,029,418 | 7/1991 | Bull . |
| 5,445,559 | 8/1995 | Gale et al. . |
| 5,451,549 | 9/1995 | Oki et al. . |
| 5,527,744 | 6/1996 | Mignardi et al. . |
| 5,605,489 | 2/1997 | Gale et al. . |
| 5,618,759 | 4/1997 | Boysel ..................................... 438/464 |

FOREIGN PATENT DOCUMENTS 1230256  9/1960  France .

*Primary Examiner*—Kevin M. Picardat
*Attorney, Agent, or Firm*—Kirkpatrick & Lockhart LLP

[57]  ABSTRACT

A cutting chuck for use with a cutting blade and for holding a semiconductor wafer in place during a dicing process and a die pick for picking the segmented semiconductor wafer from the chuck. The chuck includes a surface for supporting the wafer and several ports in the surface connected to a vacuum source. Preferably, the cutting chuck includes a housing having a base and a wall. A vacuum chamber is provided within the housing and on top of the base. A porous layer is located in housing and above the vacuum chamber. A surface layer is above the porous layer and contains ports connecting the surface supporting the wafer to the vacuum chamber via the porous layer. In a most preferred embodiment, the chuck is removeably attached to the vacuum source via a check valve. The cutting chuck may also include recesses in the surface to prevent impingement on the cutting chuck by a cutting blade during wafer dicing. The die pick includes a pick head having a surface for contacting the plurality of die sawn from a wafer. The surface includes a plurality of ports that are in fluid communication with a vacuum source. The die pick picks the plurality of die from the chuck for further processing.

18 Claims, 14 Drawing Sheets

5,953,590

METHOD AND APPARATUS TO HOLD INTEGRATED CIRCUIT CHIPS ONTO A CHUCK AND TO SIMULTANEOUSLY REMOVE MULTIPLE INTEGRATED CIRCUIT CHIPS FROM A CUTTING CHUCK

This a divisional of U.S. patent application Ser. No. 08/756,981 filed on Nov. 26, 1996 now U.S. Pat. No. 5,803,797.

BACKGROUND OF THE INVENTION

1. Field of the Invention

The present invention is directed generally to a method and apparatus to hold integrated circuit chips on, and remove the chips from, a cutting chuck without the use of an adhesive or a wafer frame. More particularly, the invention is directed to a method and apparatus using differential pressure to both hold the chips on the cutting chuck and to remove the chips from the cutting chuck.

2. Description of the Background

Integrated circuits have touched almost every aspect of society, such as children's games and toys, engine computers in automobiles, personal computers in homes and offices, and controllers in industrial processes. Better ways to fabricate integrated circuits are constantly being sought.

Integrated circuits are fabricated on semiconductor wafers, and each wafer typically contains between 50 and 1,000 individual integrated circuits, depending on the size of the wafer and the size of the individual integrated circuits. Between the integrated circuits are spaces, known as "street indices", which separate the individual integrated circuits on the wafer. Street indices are as small as possible, and are typically four mil to six mil wide. In a process known as "dicing", wafers are cut along the street indices to form separate integrated circuits, known as "dice". A street index which has been cut is known as a "street". When the dicing process is completed, the streets form a grid which defines the dice cut from the wafer.

The dicing process is performed with a cutting assembly having a circular cutting blade. The design and use of the cutting assembly and cutting blade are well known in the prior art, and such devices may be obtained from Disco Hi Tec America, Inc., located in Santa Clara, Calif. The cutting blades are about one mil thick and spin at speeds between 30,000 and 60,000 revolutions per minute. Cutting blades are often nickel-plated with a diamond grit cutting edge to insure smooth, clean cuts, with minimal fraying and splintering.

Wafers are placed on a smooth, level surface, known as a "cutting chuck", where they are diced by the cutting blade. During the dicing process, the cutting blade will occasionally protrude below a wafer and into the underlying cutting chuck. The contact between the cutting blade and cutting chuck accelerates the wear on the cutting blade, and often breaks the cutting blade and results in damage to the cutting chuck.

It is well known in the prior art to use a wafer frame and adhesive tape to maintain dice in place during the dicing process. The wafer frame is generally flat and defines an opening which is larger than the wafer. The adhesive tape is attached to the wafer frame and stretched across the opening. A wafer is secured to the adhesive tape within the opening, and the frame is secured, for example by a vacuum, to the cutting chuck for dicing. After the dice have been cut, the frame, along with the adhesive tape and the dice, are removed from the cutting chuck. The dice are separated from the adhesive tape, the adhesive tape is removed from the frame, and the frame is reused. The adhesive tape is known as "sticky back" and is usually a polymer-based film, such as polyvinyl chloride ("PVC"), with an adhesive coating on one side. The adhesive tape is usually about 3 mils thick. The dice stick to the adhesive, so that when the wafer is cut the dice remain in place on the cutting chuck and are not scattered. Because a cutting blade extends slightly below the wafer, the cutting blade is exposed to the adhesive tape. The adhesive binds to the cutting blade, causing accelerated blade wear and "gumming-up" the cutting blade. A gummed-up cutting blade reduces the effectiveness of the cutting blade, increases friction between the cutting blade and the wafer, and increases the tendency of the cutting blade to bind and break. Heat is generated from friction between the cutting blade and both the wafer and the sticky-back. The faster the cutting blade is moved through the wafer, the more heat is generated, and that heat is increased when the cutting blade is gummed-up. In addition, the risk of the cutting blade binding increases as the temperature of the cutting blade increases. Furthermore, the integrated circuits may be damaged by the heat. As a result, the heat generated by the dicing process, and all of the undesirable side effects of the heat, limits the rate at which the cutting blade can be moved across a wafer. As the rate of the dicing processes decreases, the amount of time required to dice a wafer increases.

The accelerated wear and damage caused to cutting blades from contact with the chuck and the adhesive requires that they be replaced after dicing only about five or six wafers. Worn cutting blades lack the sharpness to cleanly cut a wafer, and cutting blades exposed to adhesives have rough sides and an irregular cutting surface formed from hardened adhesive picked up during previous cuts of a wafer. The continued use of a worn cutting blade may result in damaged or totally destroyed wafers caused by a cutting blade breaking and spraying debris across the wafer. Replacing cutting blades is expensive not only in terms of the costs of the cutting blade, but also in terms of down time of the dicing process and interruption of the fabrication process while an old cutting blade is being removed and a new cutting blade is being installed.

After the dicing process is completed, the dice need to be tested and the good dice separated from the bad. The wafer, frame, along with the associated adhesive tape and dice, may be removed from the chuck and placed at a testing station, or the testing may be done on the cutting chuck. During testing, each die is individually tested to determine whether it is functional, and if so, whether it meets the specifications set for the chip. Information regarding which die are good and which are bad, along with other test data, is stored in a memory device. Since there are almost always some bad dice, a die pick is used to selectively remove only the good dice for further processing. The bad dice remaining on the adhesive tape are discarded.

The construction of die picks are well known in the prior art. Die picks include a moveable suction device which develops a pressure differential relative to the ambient pressure around the die pick. The suction device has a single, small suction opening or port, so that it engages only one die at a time. The suction device is maneuvered against a single good die and a suction is used to engage the die. Once engaged, the die pick moves the die to another station and releases it for further transport or processing.

As stated above, wafers often yield as many as 1,000 dice. As a result, a large number of dice must be removed by the die pick. Because die picks move only a single die at a time, they are a bottleneck in the process of fabricating semiconductor chips. For example, a conventional die pick typically requires between one half of a second and one second to remove one die from a group of dice and place it on another processing station. If five hundred dice need to be moved by the die pick, a delay of between 250 and 500 seconds occurs while the dice are being removed.

Thus, the need exists for an improved method and handling assembly which reduces the amount of time required to separate good dice from bad dice. In particular, the need exists for a handling assembly which can remove all of the good dice in a single operation.

Furthermore, the need exists for an improved cutting chuck which reduces the amount of wear and damage to a cutting blade. In particular, the need exists for a cutting chuck which does not interfere with a cutting blade during dicing, and which prevents contact between a cutting blade and adhesives currently used to secure a wafer during dicing.

SUMMARY OF THE INVENTION

The present invention is directed generally to a cutting chuck for use with a cutting blade and for holding a semiconductor wafer in place during a dicing process. The chuck includes a surface for supporting the wafer and several ports in the surface connected to a vacuum source. Preferably, the cutting chuck includes a housing having a base and a wall. A vacuum chamber is preferably provided within the housing. A porous layer is located above the vacuum chamber. A surface layer is above the porous layer and contains ports connecting the surface supporting the wafer to the vacuum chamber via the porous layer. In a most preferred embodiment, the chuck is removeably attached to the vacuum source via a check valve. The cutting chuck may also include recesses in the surface to prevent impingement on the cutting chuck by a cutting blade during wafer dicing.

The present invention also includes a method of processing semiconductor wafers by providing the cutting chuck, placing the wafer on the cutting chuck, and applying a negative pressure differential at the surface of the cutting chuck in order to secure the wafer on the chuck. Preferably, the method also includes simultaneously cutting several streets on the wafer.

The present invention solves the above-mentioned shortcomings in the prior art by providing a cutting chuck that holds a wafer without the use of any adhesives, such as stickyback. In addition, the present invention eliminates all obstructions so that the cutting blade encounters only the wafer during the dicing process, thereby improving both the useful life of the cutting blade and the rate at which wafer dicing may be conducted.

The present invention is also directed to a die pick for relocating segmented die from the chuck for further processing. The die pick includes a pick head that has a surface for contacting a plurality of die sawn from a wafer. The surface of the pick head includes a plurality of ports. A vacuum source is in fluid communication with said ports. The pick head is interchangeable with other pick heads having a different configuration of ports for picking variable sized die from the chuck.

In an another embodiment, the die pick has a pick head having a plurality of column members. The column members have a base having a surface for contacting the plurality of die sawn from a wafer. The surface of the column member also includes a plurality of ports that are in fluid communication with a vacuum source. Each of the column members are interchangeable with other column members that have different configuration of ports along one axis to enable the pick head to pick die of variable sizes. Additionally, the pick head includes a repositioning member for selectively moving the column members relative to one another along another axis for picking die of variable sizes. The ports of the column members may be selectively connectable to the vacuum source wherein a plurality of valves are used to selectively connect the ports to the vacuum source to enable the pick head to selectively pick die from the chuck. Alternatively, the die pick may remove the die from the chuck to a sorting operation for selectively sorting the good die from the remainder of the sawn die.

The present invention solves the above-mentioned problem as the die pick may pick all of the segmented die from the chuck simultaneously thus significantly reducing the amount of time for removing the sawn die from the chuck. Additionally, the die pick can select only the good die in a single operation. Alternatively, the die pick can remove all of the die to a sorting operation to separate the good die from the remainder of the sawn die.

BRIEF DESCRIPTION OF THE DRAWINGS

For the present invention to be clearly understood and readily practiced, the present invention will be described in conjunction with the following figures, wherein.

DESCRIPTION OF THE PREFERRED EMBODIMENTS

It is to be understood that the figures have been simplified to illustrate only those aspects of the cutting chuck and die pick head which are relevant for a clear understanding of the present invention, while eliminating, for the purpose of clarity, other elements which may be found in typical cutting chucks and die picks. Those of ordinary skill in the art will recognize that other elements may be desired or required to produce operational cutting chucks and die picks. However, because such elements are well known in the art, and because they do not further aid in the understanding of the present invention, a discussion of such elements is not provided herein.

Figure 1:
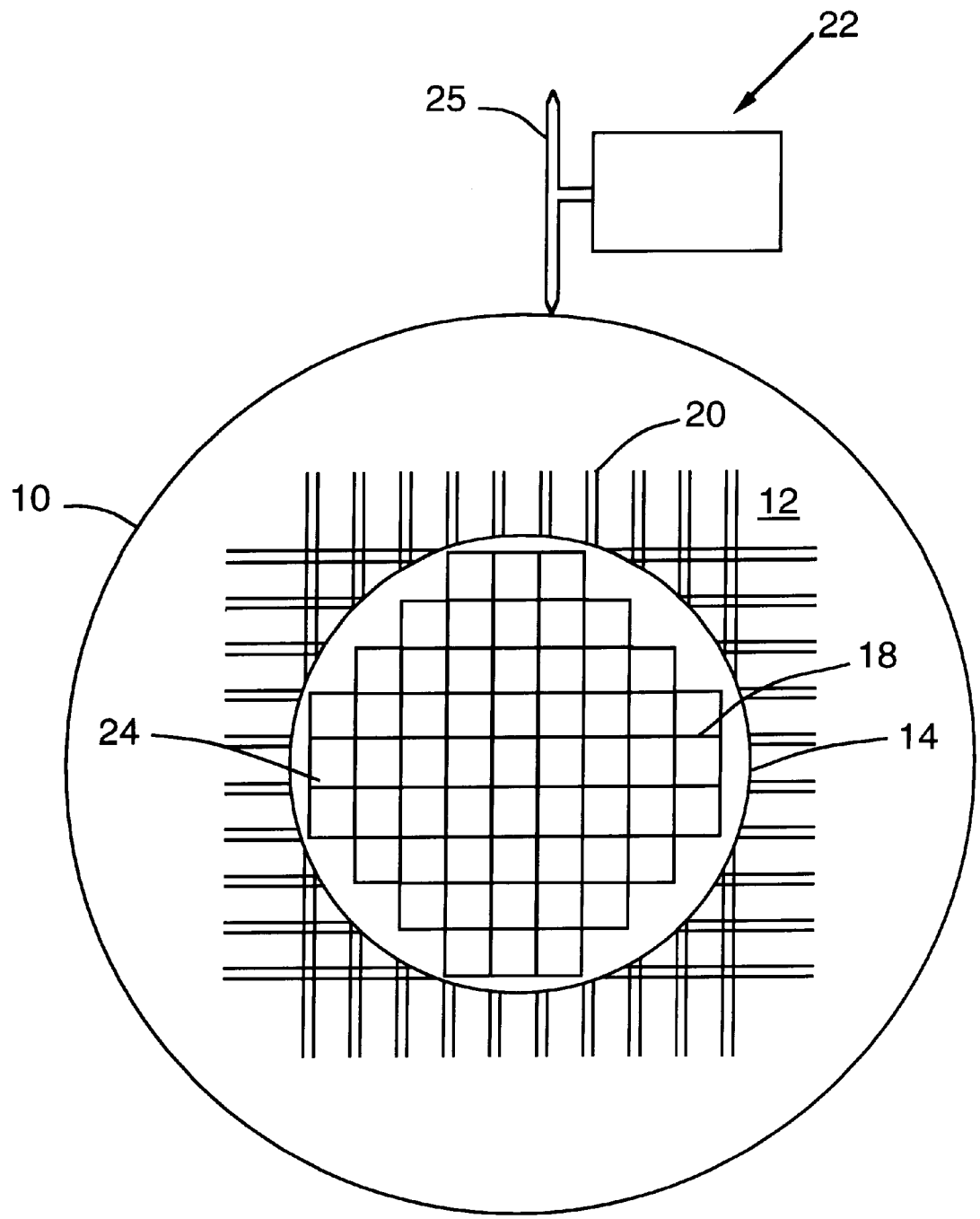
FIG. 1 is a top plan view of a chuck constructed in accordance with the present invention.
Figure 2:
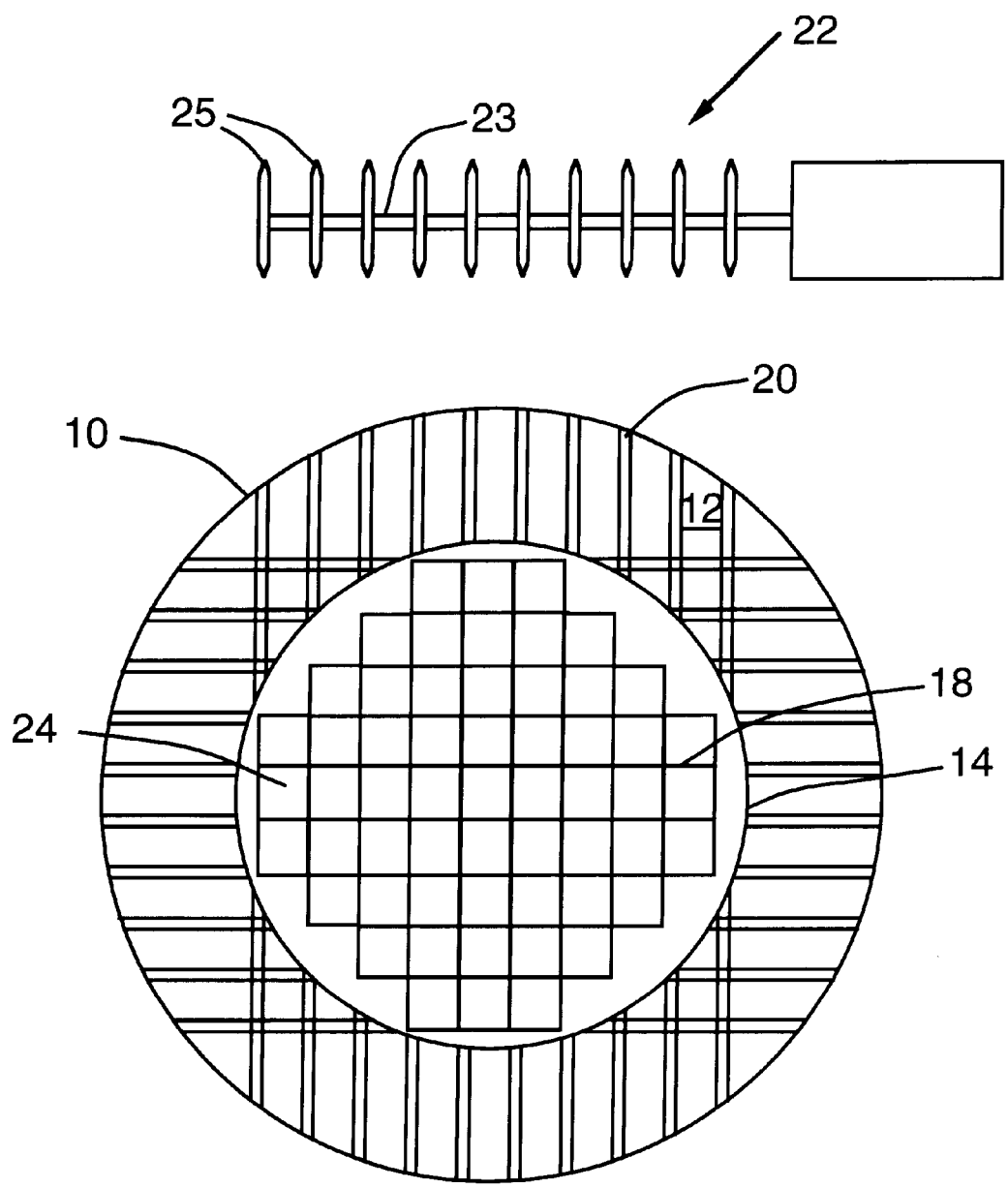
FIG. 2 is a top plan view of an alternative embodiment of the chuck illustrated in FIG. 1.

FIG. 1 is a top plan view of a cutting chuck 10 constructed in accordance with the present invention. The chuck 10 is preferably circular, although it may also be other shapes, such as square. The chuck 10 includes a surface 12 on which a semiconductor wafer 14 may be placed. The wafer 14 includes a number of individual integrated circuits separated by street indices 18. The street indices 18 form a pattern on the wafer 14 and define the individual integrated circuits. As shown in FIG. 1, the street indices 18 typically form a pattern of vertical and horizontal lines. Recesses 20 are formed in the chuck 10 and correspond to the street indices 18 on the wafer 14. The recesses 20 may extend beyond the edge of the wafer 14 only far enough to allow a cutting assembly 22 to complete a cut through the wafer 14 along the street indices 18, so as to separate the individual integrated circuits into dice 24. In that embodiment, the position of the cutting assembly 22 relative to the chuck 10 is precisely monitored and controlled so that the cutting assembly 22 does not impinge upon the chuck 10 where the recesses 20 end. Preferably, as shown in FIG. 2, the recesses 20 extend to the edge of the chuck 10. One advantage of extending the recesses 20 to the edge of the chuck 10 is that the cutting assembly 22 can be driven across the chuck 10 without regard to the position of the cutting assembly 22 relative to the wafer 14 or the chuck 10, thereby simplifying the operation of the cutting assembly 22. Furthermore, the recesses 20 form channels to carry debris, created when the wafer 14 is diced, away from the surface of the chuck 10. The debris is carried away with water that is sprayed on the chuck during dicing in order to cool the chuck 10, the wafer 14, and the cutting assembly 22.

FIG. 2 illustrates an alternative embodiment of the present invention. Unlike prior art cutting assemblies 22 which have a single cutting blade 25, the present invention may include multiple cutting blades 25. The blades 25 may be rigidly attached to a common shaft 23, or may be independently controlled. In the former embodiment, the recesses 20 are preferably extended to the edge of the chuck 10 so that the cutting assembly 22 and blades 25 can be moved across the chuck without any of the blades 25 impinging on the chuck 10, resulting in simple and efficient operation of the cutting assembly. The use of multiple blades 25 during the dicing process is made possible because, as described in detail below, the present invention eliminates the need for sticky back, thereby significantly reducing the heat generated during the dicing process. The reduction in heat realized with the present invention allows the use of multiple cutting blades without damaging the integrated circuits. Multiple blades 25 may be used to cut a wafer 14 along several street indices 18 at the same time, thereby decreasing the time required to dice a wafer 14. Street indices 18 are oriented on a wafer 14 in two different directions, horizontal and vertical. In a preferred embodiment of the invention, the cutting assembly 22 includes enough blades 25 to simultaneously cut along all horizontal street indices 18, and thereafter simultaneously cut along all vertical street indices 18. That embodiment allows for an entire wafer 14, regardless of its size or number of street indices 18, to be completely diced by only two passes of the cutting assembly 22. As a result, the dicing process can be accomplished much more quickly and efficiently with the present invention than was possible in the prior art.

Increased dicing speeds can also be realized when only a single blade 25 is used with the present invention, as illustrated in FIG. 1. The cutting assembly 22 may be moved at a much faster rate than is possible with prior art chucks 10 because the absence of sticky back in the present invention significantly reduces the heat generated during the dicing process. Because less heat is generated, the present invention allows faster dicing speeds.

Although the cutting assembly 22 illustrated in FIGS. 1 and 2 has been described as moving relative to the chuck 10, it is also possible for the cutting assembly 22 to have a fixed position and the chuck 10 moved relative to the cutting assembly 22.

Figure 3:
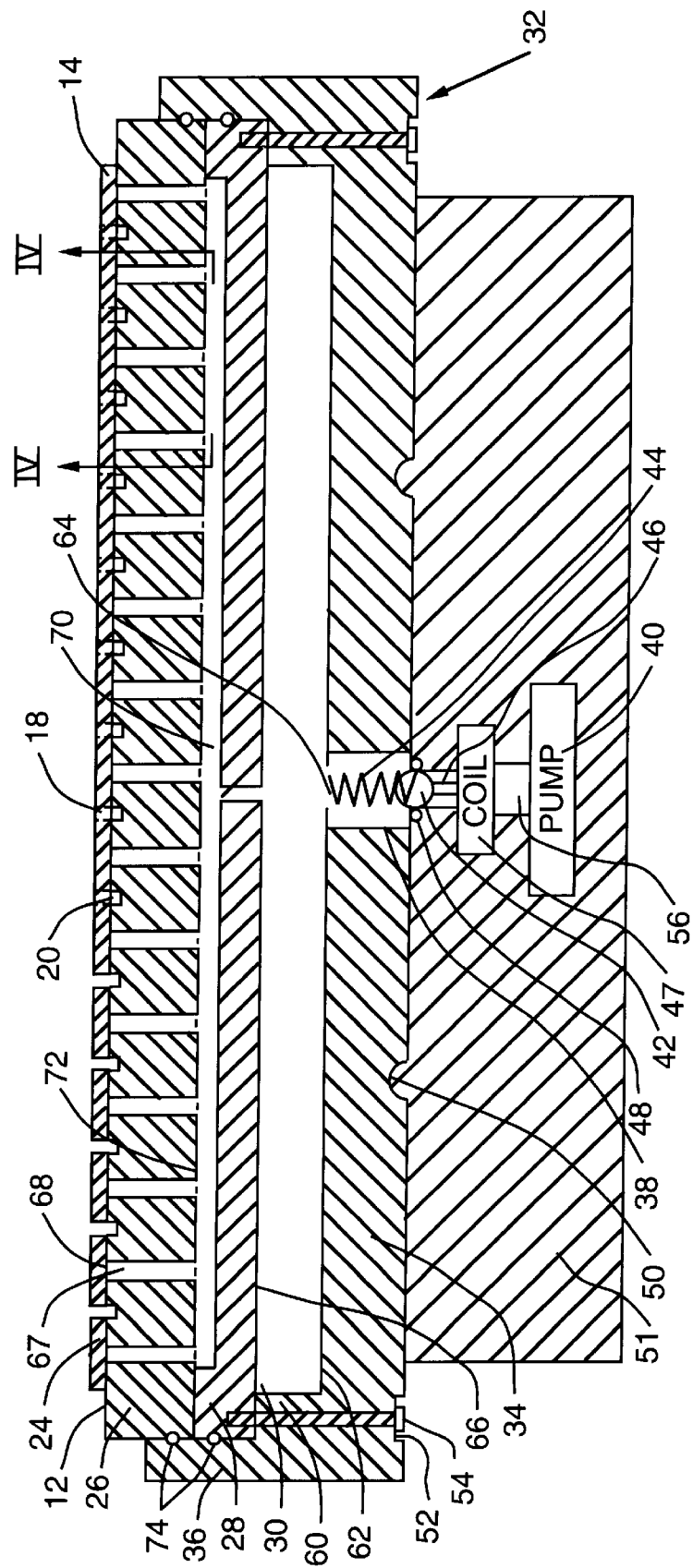
FIG. 3 is a cross-sectional view of a chuck constructed in accordance with the present invention.

FIG. 3 is a cross-sectional view of a chuck 10 constructed in accordance with the present invention. The chuck 10 includes a surface layer 26, a porous layer 28, and a vacuum chamber 30, all of which are supported in a housing 32.

The housing 32 includes a base 34 and a wall 36. The base 34 includes a check valve 38 which connects and disconnects the vacuum chamber 30 with a vacuum pump 40. The check valve 38 is preferably a ball and seat valve including a ball 42 and a spring 44 which biases the check valve 38 closed. The check valve 38 includes a solenoid, having a plunger 46 and a coil 47. The plunger 46 is in contact with the ball 42 and is actuated by the coil 47. The plunger 46 pushes the ball 42 against the spring 44 to open the check valve 38. The vacuum pump 40 is connected to the check valve 38 by a passage 56. The pump 40 may be an electrically-driven pump, or other means for providing a vacuum to the chuck 10. The housing 32 and vacuum pump 40 are preferably separable from one another at the check valve 38. An O-ring seal 48 is preferably provided at the check valve 38 to prevent leakage when the chuck 10 is connected to the vacuum pump 40.

In embodiments where the chuck 10 is being moved from one location to another, the base 34 may also include centering and locking devices 50 for aligning and affixing the housing 32 to a mounting base 51. The centering and locking devices 50 are preferably semispherical-shaped openings in the base 34 which engage complementary pins on a mounting base 51, to align and engage the chuck 10 in the proper position and orientation.

The base 34 also includes several openings 52 for screws 54, or other means for exerting force on one or more of the components within the housing 32, as described in more detail below. The housing 32 is preferably made from stainless steel, although other materials may be used, such as metals and hard plastics which can withstand the applied pressure differential of the vacuum and the heat and vibration generated during the dicing process.

The vacuum chamber 30 is located within the housing 32 and is connected through the check valve 38 to the vacuum pump 40. The vacuum chamber 30 is sealed along its side walls 60 and bottom wall 62, with the exception of an opening 64 for connection to the check valve 38. The top 66 of the vacuum chamber 30 is formed by an interface between the vacuum chamber 30 and the porous layer 28. When the check valve 38 is open and the vacuum pump 40 is operating, air is evacuated from the vacuum chamber 30 through the check valve 38, through the passage 56, and through the vacuum pump 40. As a result, a pressure drop is created within the vacuum chamber 30. Preferably, the pressure drop is between 15 and 22 inches of mercury.

The use of porous material as a support structure for chucks is well known in the art of semiconductor processing, and the porous layer 28 is preferably included in the present invention as a support structure for the surface layer 26. The porous layer 28 also preferably includes a plurality of vacuum passages 67 that channels the vacuum from the vacuum chamber 30, through the porous layer 28, and to the surface layer 26. The porous layer 28 is not required, and may be eliminated in alternative embodiments of the present invention, as described below.

The surface layer 26 is located adjacent to the porous layer 28 and within the wall 36 of the housing 32. The surface layer is preferably made from silicon and is approximately 28 mils thick. The surface layer 26 includes the surface 12 which supports the wafer 14. The surface 12 includes vacuum ports 68 which are preferably circular in shape and distributed on the surface 12 so that one vacuum port 68 is located approximately at the center of each die 24 on the wafer 14. Many alternative port designs may be constructed by one of ordinary skill in the art, such as a single port located at approximately the center of each die, with four smaller ports located near the corner of each die 24. The ports 68 extend through the surface layer 26 and are in fluid communication with the vacuum passage 67. Preferably, the ports 68 are generally parallel and run in a straight line from the surface 12, through the surface layer 26, to a bottom side 72 of the surface layer 26 adjacent to the vacuum passage 67. The diameter of the ports 68 depends on the size and mass of the dice 24 and the pressure drop present at the ports 68. Obviously, as the mass of the dice 24 increases, the diameter of the port 68 and/or the pressure drop must also increase in order to safely hold the dice 24 onto the surface. The diameter of the ports 68, however, should not be larger than the dice 24, or the dice 24 may be pulled into the ports 68, potentially damaging both the dice 24 and the chuck 10, and necessitating the extractions of the dice 24 from the ports 68.

A different surface layer 26 is preferably used for each different street index 18 pattern so that the at least one of the ports 68 is aligned at approximately the center of each die 24 on the wafer 14. Alternatively, the surface layer 26 may include a large number of evenly-spaced ports 68 without regard to alignment with the center of each die 24. In that embodiment, the ports 68 are sufficiently dense so that, for any size of wafer 14 or street index 18 pattern that can reasonably be expected to be placed on the chuck 10, at least one port 68 will be located beneath each die 24 on the wafer 14. In that embodiment, a single surface layer 26 may be used for all sizes of wafers 14 and all street index 18 patterns.

Seals 74, such as o-ring seals, are preferably located between the porous layer 28 and the wall 36 of the housing 32, and between the surface layer 26 and the wall 36 of the housing 32. The seals 74 prevent leakage into the vacuum chamber 30 which may occur between the surface 26 and porous 28 layers and the wall 36.

Recesses 20 are preferably formed in the surface 12 of the surface layer 26 to prevent impingement of the cutting blade 25 on the surface layer 12. A recess 20 corresponds to each street index 18 of the wafer 14. The recesses 20 are at least as wide as the cutting blade 25, and are at least as deep as the cutting blade 25 can be reasonably expected to protrude below the top surface 12 of the chuck 10. A cutting blade 25 is typically about one mil wide and protrudes about five mils below the surface 12 of the chuck 10. The present invention preferably uses recesses 20 about five mils wide and between approximately ten to fifteen mils deep, which will accommodate most cutting blades 25 currently used in the semiconductor processing industry.

The recesses 20 in a chuck 10 may correspond to the street indices 18 of one size wafer 14 having one pattern of street indices 18, so that there is a one-to-one correspondence between the recesses 20 in the chuck 10 and the street indices 18 of the wafer 14. In that embodiment, a different surface layer 26 is used for each different size of wafer 14 and each different street index 18 pattern. Alternatively, a surface layer 26 may contain recesses 20 which correspond to several different street index 18 patterns, so that one surface layer 26 may be used with several wafers 14 having different sizes and street index 18 patterns. In that embodiment, there is not a one-to-one correspondence between the recesses 20 in the surface layer 26 and the street indices 18 of the wafer. 14, because there are more recesses 20 in the surface layer 26 than there are street indices 18 in any one wafer 14. As a result, when the wafer 14 is diced, not all of the recesses 20 are used. A surface layer 26 having recesses 20 corresponding to several street index 18 patterns has the advantage of reducing the number of times that the surface layer 26 needs to be changed when wafers 14 of varying sizes and street index 18 patterns are being diced.

The recesses 20 are preferably formed by either a cutting process or an etch process. Forming recesses 20 through a cutting process can be done simply and easily with a cutting device, such as the cutting assembly 22, by cutting the recesses 20 into the surface layer 26. Forming the recesses 20 with an etch process can be done in several ways. Preferably, however, a nitride mask having openings where the recesses 20 are to be formed is formed on the surface layer 26. If the surface layer 26 is made of silicon, a potassium hydroxide etch (KOH) is used to etch silicon at a rate of about 6–7 microns per hour at 52° C. The nitride mask can then be removed, leaving only the recesses 20.

The recesses 20 may be formed in many cross-sectional shapes. For example, recesses 20 may have cross-sectional shapes that are squared, "v"-shaped, semi-circular, semi-elliptical, and semi-trapezoidal, to suit the cutting blade of the cutting assembly 22. When the recesses 20 are formed by a cutting process, the shape of the recess 20 is easily controlled by selecting an appropriately shaped blade 25. The shape of the recess 20 can be controlled in an etch process with the proper choice of isotropic and anisotropic etches, as is well known in the art of semiconductor etching.

The recesses 20 in the surface layer 26 allow the wafer 14 to be diced without any risk of the cutting blade 22 contacting the surface layer 26. As a result, the chuck 10 illustrated in FIG. 3 substantially reduces wear on the cutting blade 22, thereby extending the cutting blade's useful life.

In operation, when it is desired to hold the wafer 14 against the surface 12 of the chuck 10, the vacuum pump 40 is started and the check valve 38 is opened by the plunger 46. Air is pumped out through the vacuum pump 40, and a vacuum is created within the vacuum chamber 30 and is channeled through the vacuum passages 67 and to the ports 68, creating a pressure differential with the ambient pressure around the chuck 10. The pressure differential between the ports 68 and the ambient pressure around the chuck 10 holds the wafer 14 against the surface 12. When the cutting assembly 22 (shown in FIGS. 1 and 2) cuts the wafer 14 along the street indices 18, individual dice 24 are held in place by the pressure differential at the ports 68.

The chuck 10 may be removed from the vacuum pump 40 and still maintain a pressure differential to hold the dice 24 on the surface 12. The check valve 38 is closed to retain the vacuum and the chuck 10 is separated from the vacuum pump 40 at the check valve 38. The integrity of the vacuum chamber 30 is maintained with the check valve 38 closed, and the pressure differential is maintained at the ports 68 by a vacuum reserve in the vacuum chamber 30. For a period of time, the vacuum reserve in the vacuum chamber 30 will compensate for any loss of vacuum caused by leakage. During that time, the chuck 10 may be moved to another station for further processing of the dice 24. After the dice 24 are removed from the chuck 10, the chuck 10 may be returned to the dicing station and reused.

From time to time the porous layer 28 and surface layer 26 may need to be removed from the housing 32 for inspection, maintenance, or replacement. Preferably, the surface 26 and porous 28 layers are held in the housing 32 by a friction fit between the surface 26 and porous 28 layers, the O-rings 74, and the wall 36. In order to facilitate removal of the surface 26 and porous 28 layers, several screws 54 are provided through openings 52 in the base 34. The end of each screw 54 is flat and contacts the porous layer 28. The head of each screw 54 protrudes through the openings 52 and is accessible near the base 34 of the housing 32. The openings 52 in the base 34 are threaded, so that when the screw 54 is turned it exerts pressure against the porous 28 and surface 26 layers, forcing them out of the housing 32. Alternatively, the openings 52 may not be threaded, and one or more elongated member may be pushed through the openings 52 to facilitate removal of the surface 26 and porous 28 layers.

Figure 4:
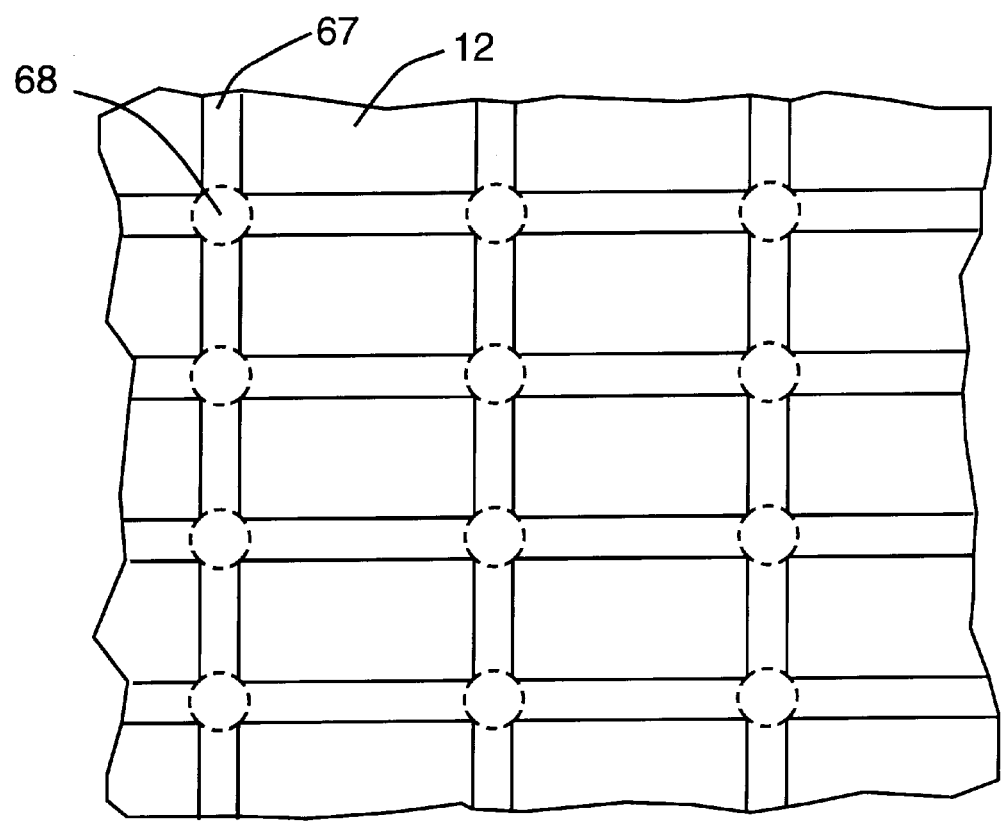
FIG. 4 is a top cross-sectional view along line IV—IV from FIG. 3 of a chuck constructed in accordance with the present invention.

FIG. 4 is a top cross-sectional view along line IV—IV from FIG. 3 of a portion of the chuck 10 illustrating the vacuum passage 67. The vacuum passage 67 interconnects the ports 68 (shown in broken lines) in the chuck 10 in a grid pattern to provide multiple paths to each port 68. Alternative designs for the vacuum passage 67 may, of course, be used.

Figure 5:
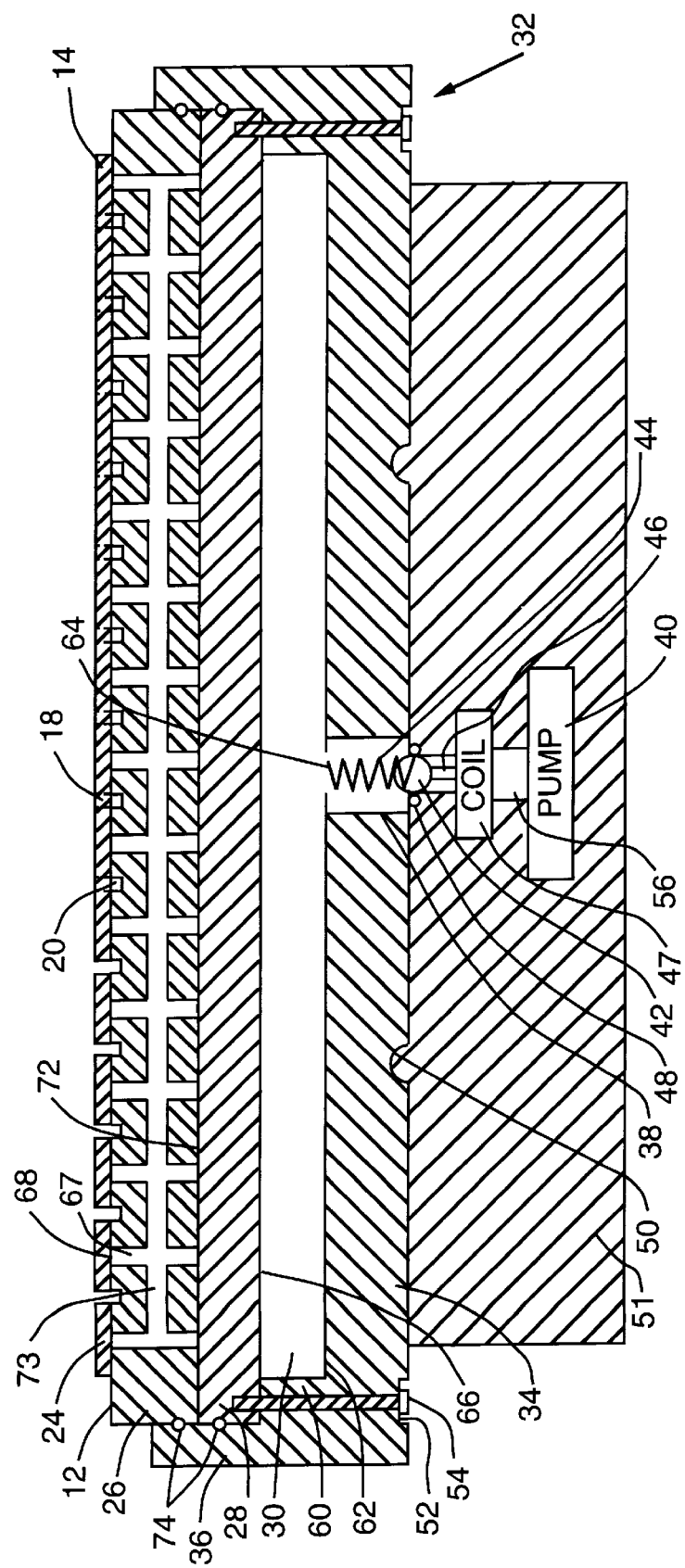
FIG. 5 is a cross-sectional view of an alternative embodiment of a chuck constructed in accordance with the present invention.

FIG. 5 is a cross-sectional view of an alternative embodiment of a chuck 10 constructed according to the present invention. In that embodiment, the vacuum passage 67 is eliminated and the vacuum is channeled through the porous layer 28. Since all of the air to the vacuum pump 40 passes through the opening 64 to the check valve 38, there is sometimes a tendency for the vacuum to be uneven at the surface layer 26. The porous layer 28 acts as a diffuser and enhances uniform air flow at ports 68 in the surface layer 26. Without the porous layer 28, more air may flow through ports 68 in the center of the surface layer 26, closest to the opening 64, than at the edge of the surface layer 26, which is farther from the opening 64. The porous layer 28 is preferably formed of a ceramic, such as alumina, and has a generally uniform resistance to air flow. The air flow resistance of the porous layer 28 can be varied by a skilled practitioner to achieve a desired pressure drop at the interface between the porous layer 28 and the ports 68.

Figure 6:
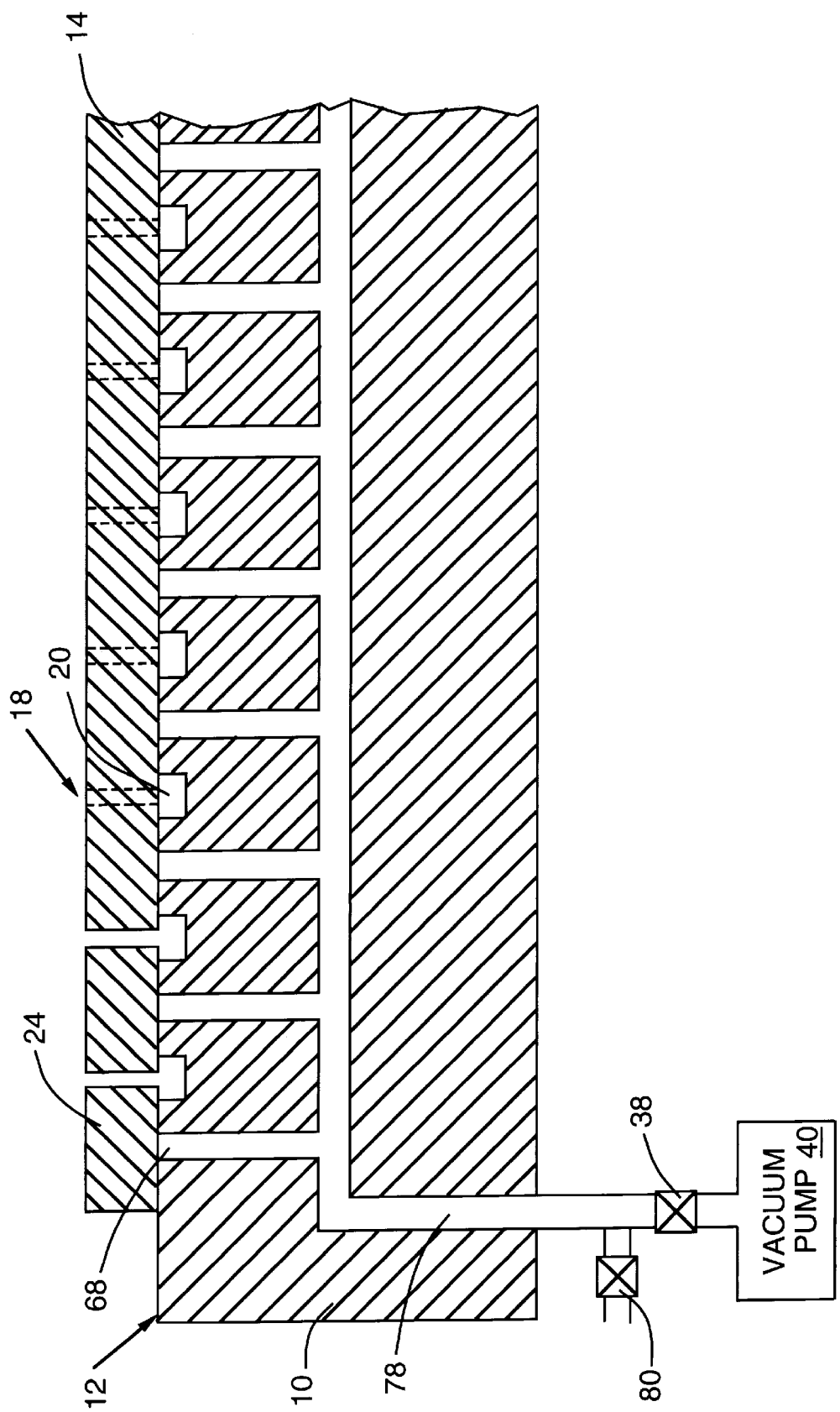
FIG. 6 is a cross-sectional view of an alternative embodiment of a chuck constructed in accordance with the present invention.

FIG. 6 is a cross-sectional view of an alternative embodiment of a chuck 10 constructed according to the present invention. The chuck 10 may be constructed in the same manner as the chuck 10 illustrated and described above with respect to FIG. 3, with the exception of the differences described below. The chuck 10 illustrated in FIG. 6 is not intended to be portable, and thus no need exists for a vacuum chamber or a housing. A chuck 10 includes a surface 12 on which a wafer 14 may be supported. The surface 12 includes a number of ports 68 at which a pressure differential, relative to the ambient pressure around the chuck 10, is used to hold the wafer 14 against the surface 12. Preferably, recesses 20 are also provided in the surface 12 to prevent impingement by the cutting blade against the chuck 10. The ports 68 are connected to a vacuum pump 40 via a passage 78. The passage 78 is preferably common to all ports 68, although several independent passages may also be provided. The passage 78 preferably includes a check valve 38 which connects and disconnects the vacuum pump 40 to the passage 78 and the ports 68. The check valve 38 is open when the vacuum pump 40 is running, and is closed, to maintain a vacuum within the passage 78 and the ports 68, when the vacuum pump 40 is turned off.

A relief valve 80 is preferably attached to or located within the passage 78. When opened, the relief valve 80 equalizes the pressure differential between the passage 78 and ports 68 and the ambient pressure around the chuck 10, in order to facilitate easier removal of the dice 24 from the surface 12. As an alternative to the release valve 80, the vacuum pump 40 may be run in reverse to repressurize the passage 78 and the ports 68, or leakage may be allowed to slowly repressurize the passage 78 and the ports 68 over time.

Figure 7:
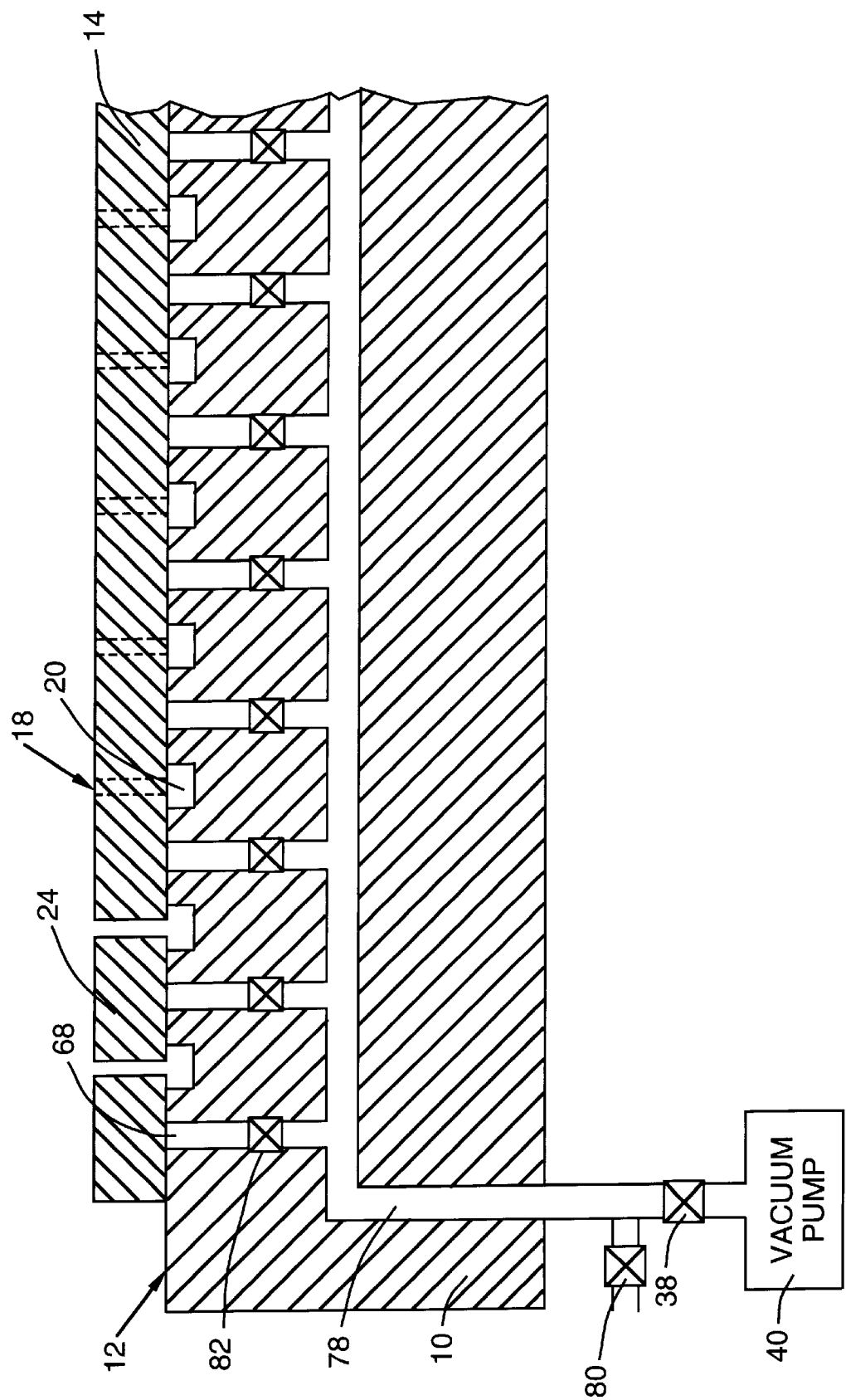
FIG. 7 is a cross-sectional view of an alternative embodiment of a chuck constructed in accordance with the present invention.

FIG. 7 is a cross-sectional view of an alternative embodiment of the chuck 10 illustrated in FIG. 6. FIG. 7 illustrates a chuck 10 having a surface 12 for supporting a wafer 14, a number of ports 68 in the surface 12, and a number of recesses 20 in the surface 12. A passage 78 common to all ports 68 connects to a vacuum pump 40 through a check valve 38, although several independent passages may be provided. Valves 82 between the passage 78 and the ports 68 are provided for individual control of the pressure differential at the ports 68. The valves 82 may control a single port 68 or a group of ports 68. Although the valves 82 are shown within the chuck 10, they may also be located outside of the chuck 10.

Figure 8:
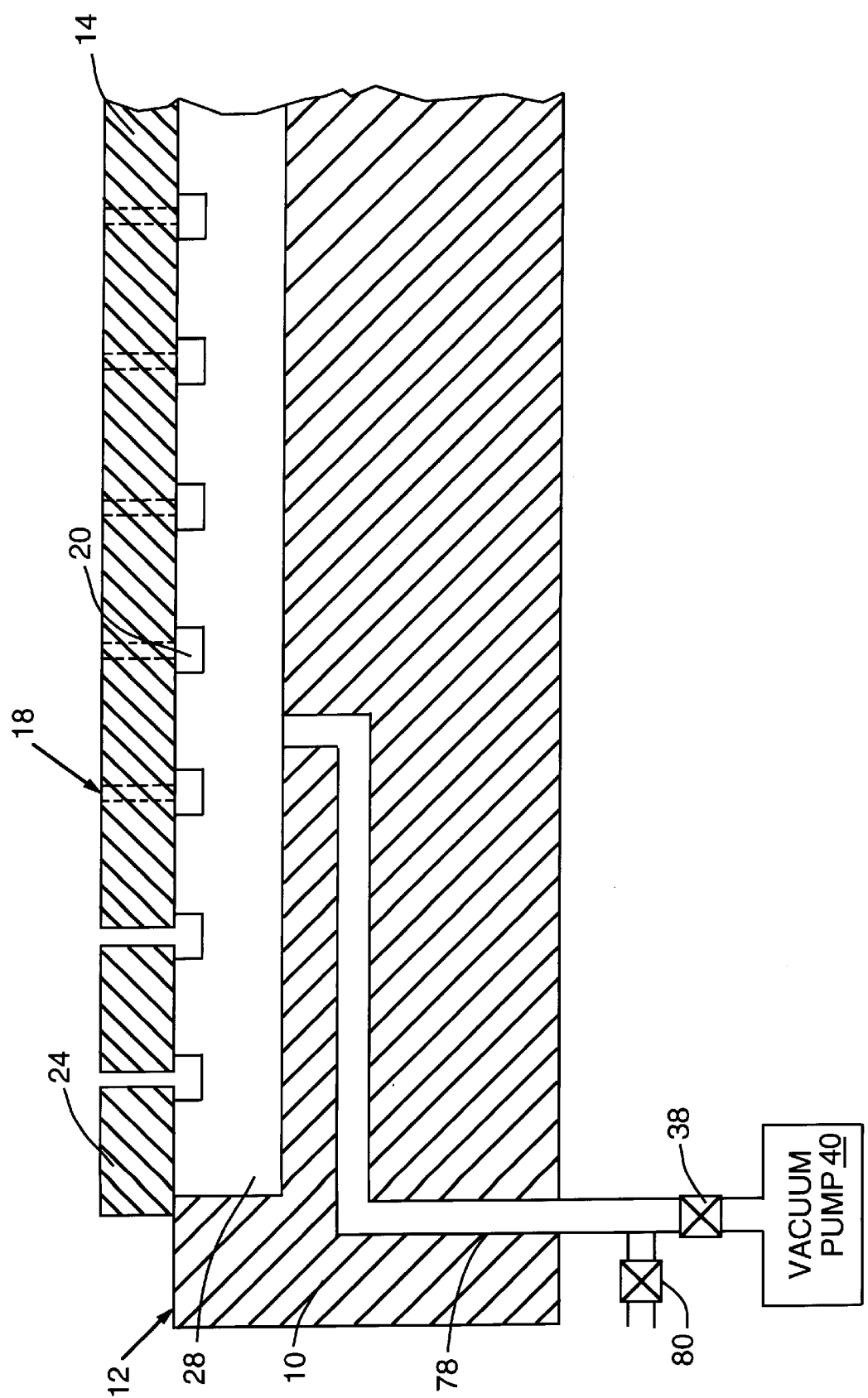
FIG. 8 is a cross-sectional view of an alternative embodiment of a chuck constructed in accordance with the present invention.

FIG. 8 is a cross-sectional view of an alternative embodiment of the chuck 10 illustrated in FIG. 6. FIG. 8 illustrates a chuck 10 having a surface 12 which supports a wafer 14 and which defines a number of recesses 20. A passage 78 connects a vacuum pump 40 through a check valve 38 to a porous layer 28. The porous layer 28 forms a portion of the surface 12 which includes the recesses 20. A large number of small openings in the porous layer 28 act as ports at which a pressure differential is present to hold the wafer 14 in place. As in the embodiment illustrated in FIG. 3, the porous layer 20 evenly distributes the air flow to the "ports". Although some air is lost through the recesses, the porous layer 28 is believed to maintain a sufficient pressure differential at the surface to hold the wafer 14 in place. The porous layer 28 is set within the chuck 10 to minimize loss of pressure differential at the surface 12 which would be caused by air leaking into the porous layer 28 from the sides or the bottom.

Figure 9:
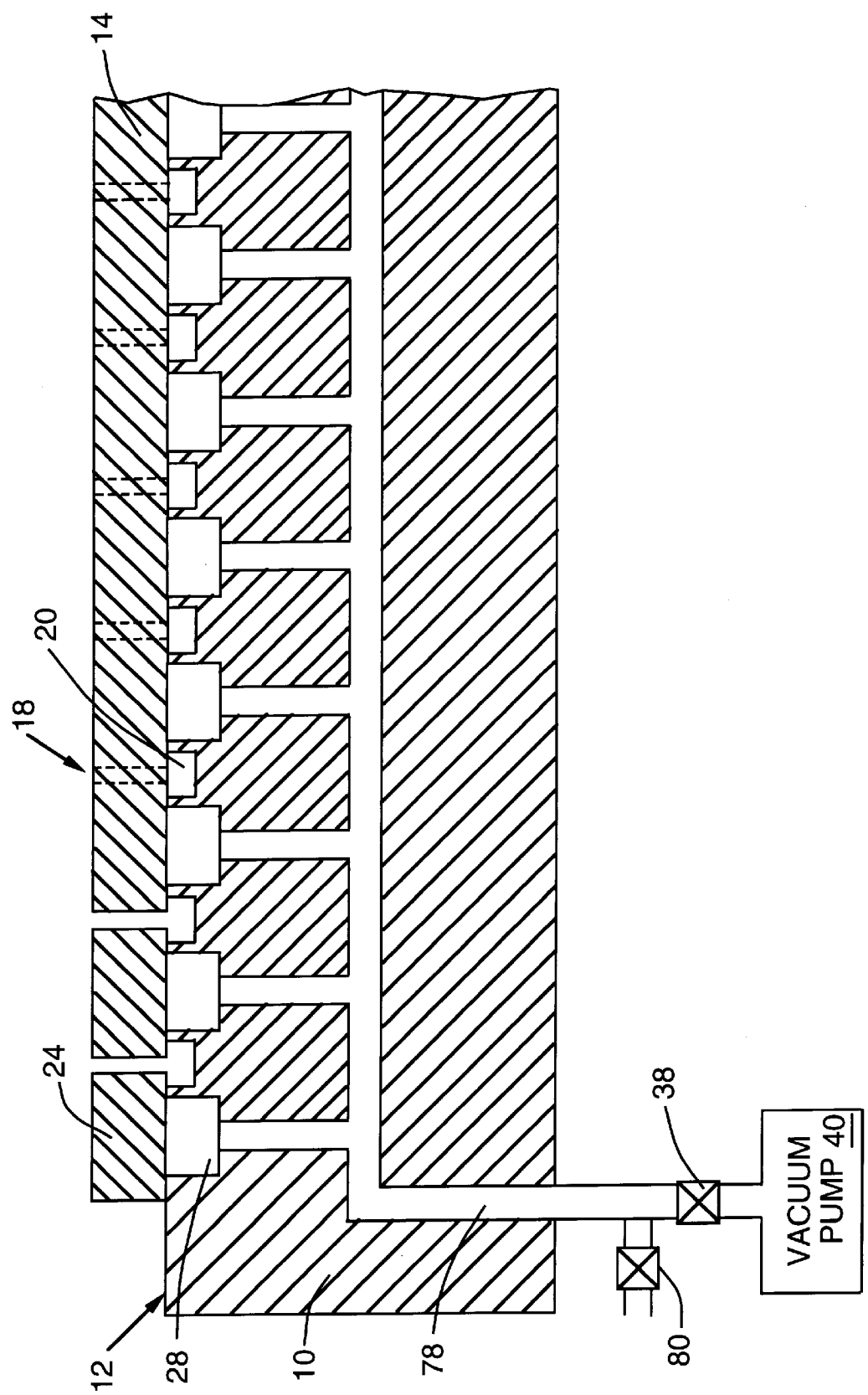
FIG. 9 is a cross-sectional view of an alternative embodiment of a chuck constructed in accordance with the present invention.

As shown in FIG. 9, in an alternative embodiment the porous layer 28 may be made of several a porous areas located between the recesses 20. In that embodiment, air does not leak into the porous layer 28 through the recesses 20 and a larger pressure differential is maintained at the surface 12.

Figure 10:
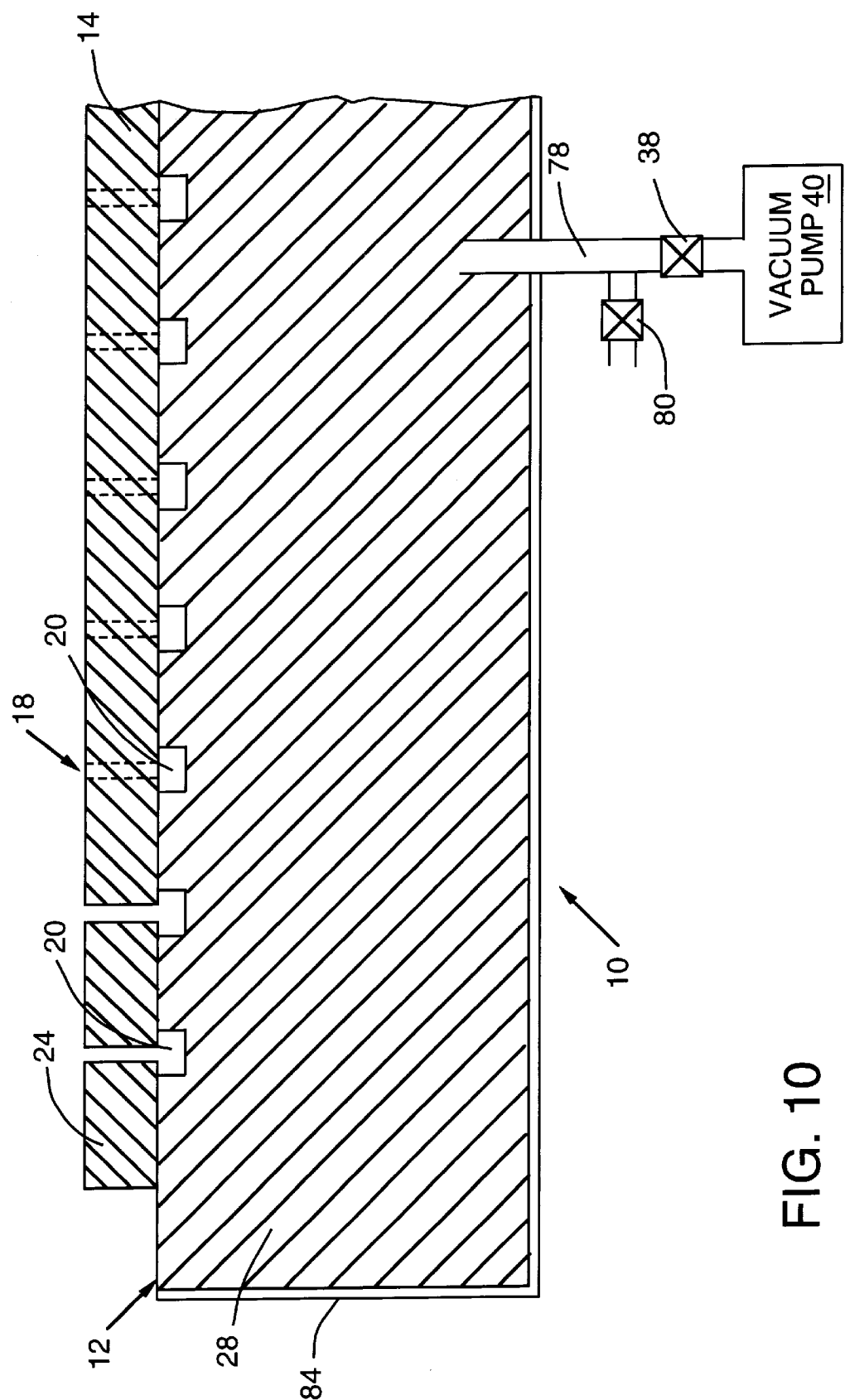
FIG. 10 is a cross-sectional view of an alternative embodiment of a chuck constructed in accordance with the present invention.

As shown in FIG. 10, in another embodiment the entire chuck 10 is made from porous material 28, preferably with recesses 20 in the surface 12 and with a vacuum pump 40 attached. That embodiment is much simpler and less expensive to manufacture than those illustrated in FIGS. 8 and 9. To reduce leakage, the bottom and sides of the chuck 10 can be sealed, for example, with a layer 84 of epoxy.

Figure 11:
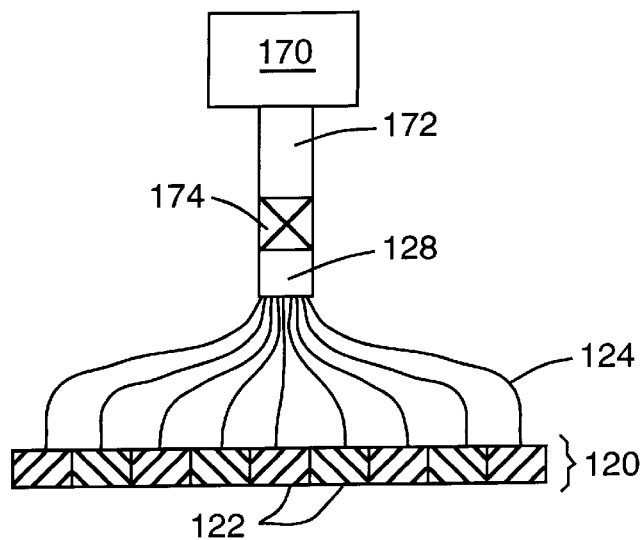
FIG. 11 is a cross-sectional view of a die pick constructed in accordance with the present invention.

Referring to FIG. 11, after the individual dice 24 are cut by the cutting assembly 22, a die pick 100 picks the dice 24 from the chuck 10 for further processing. The die pick 100 includes a pick head 120 connected to a vacuum source 170, e.g., a vacuum pump. The pick head 120 comprises a plurality of column members 122 that are movable relative to one another along the X-axis, i.e., the column members 122 may separate or move closer together during the pick operation, as will be explained in further detail below. Each column member 122 is connected to the vacuum source 170 by a plurality of fluid passageways 124, such as, for example, hoses. The fluid passageways 124 are flexible, enabling the column members 122 to move relative to one another. The fluid passageways 124 are fixably attached to the top side 126 of each column member and extend to a coupling member 128 which sealingly couples the individual fluid passageways 124 to a main vacuum passageway 172. The vacuum passageway 172 leads to the vacuum source 170 and includes a valve 174, such as, for example, a ball and seat valve, which biases closed and is opened by means of a solenoid.

Figure 12:
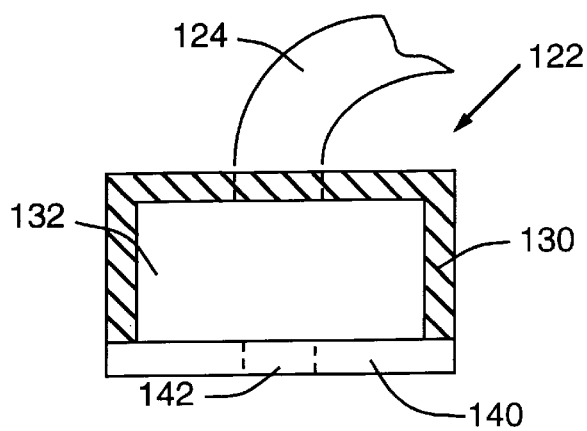
FIG. 12 is an enlarged cross-sectional view of a component of a die pick constructed in accordance with the present invention.
Figure 13:
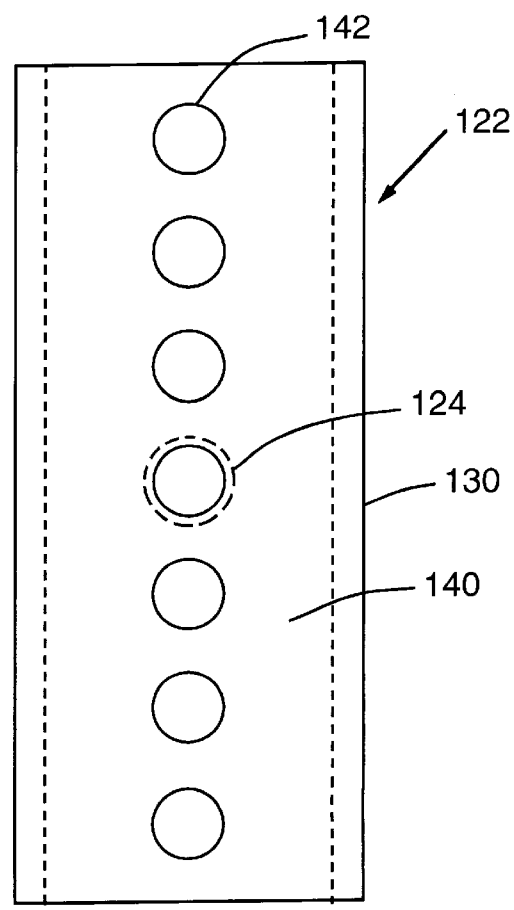
FIG. 13 is a bottom view of a preferred component shown in FIG. 12 of a die pick constructed in accordance with the present invention.

Referring as well to FIGS. 12 and 13, each column member 122 includes a housing 130 and a base 140. The housing is preferably made from stainless steel and is sealingly attached to the base 140. The base 140 is preferably made from a resilient rubber, such as, for example, santoprene, or any other rubber or plastic that can be easily molded, has flexibility, and has a soft surface such that during the pick operation, surface damage to the die 24 is avoided. In particular, the base 140 includes a plurality of vacuum ports 142 that extend longitudinally along the Y-axis of the base 140. The vacuum ports 142 are spaced to correspond to the location of the die 24 on the chuck 10 such that, during the pick operation, when the base 140 comes in contact with the die 24, at least one vacuum port 142 is aligned near the center of each die 24. The vacuum ports 142 are preferably cylindrically shaped holes that have a diameter of about 0.050 to about 0.75 mils, depending on the size of the die to be picked. Alternatively, the column members 122 may be fabricated from a unitary piece to form the housing 130 and the base 140. In a first example, the column members 122 may be made from a rigid material, such as for example, stainless steel. To obtain surface required for the pick operation, the base 140 may be laminated with, a resilient rubber, such as, for example, santoprene. In this embodiment, both the base 140 of the column member 122 and the laminated material would have vacuum ports 142 that are aligned with one another. In a second example, the column members 122 may be formed from a resilient rubber or plastic that has the required strength and flexibility, yet has a soft surface as required for the picking operation.

A vacuum chamber 132, defined by the housing 130 and the base 140, fluidly connects the vacuum ports 142 to the fluid passageway 124 of each column member 122. Thus, when the valve 174 is open, and the vacuum source 170 is operating, air is evacuated from the individual vacuum chambers 132 of each column member 122, through the passageways 124 and 172, creating a pressure drop, preferably of about 20 to 25 inches of mercury, within each vacuum chamber 132, providing a suction at each vacuum port 142 to lift die 24 from the chuck 10.

Figure 14:
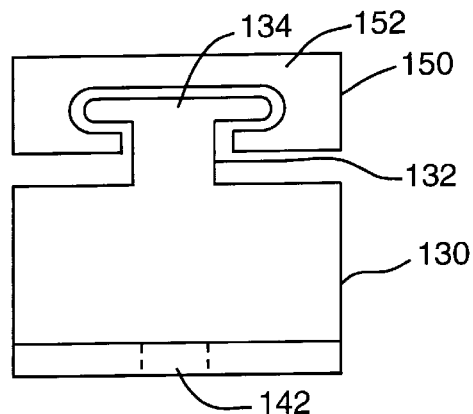
FIG. 14 is a side view of an embodiment of a die pick constructed in accordance with the present invention.

Referring as well to FIG. 14, the pick head 120 may be easily configured and modified, along both the X and Y axes, to accommodate different wafer 14 sizes, as well as different die 24 sizes. In a first instance, the individual column members 122 are removable from the pick head 120 to accommodate size changes along the Y-axis. In particular, the base 140 of the column members 122 include vacuum ports 142 that are spaced along the Y-axis to correspond to different sized wafers 14 and/or die 24. For example, the distance between adjacent vacuum ports 142 varies along the Y-axis depending upon the size of the die 24 that need to be picked from the chuck 10. By removing the individual column members 122 and replacing them with different column members 122 having vacuum ports 142 that are spaced to correspond to a different size wafer 14 and/or die 24, the same pick head 120 can be used to pick wafers and/or dies of multiple sizes. Thus, it is not necessary to use a different pick head 120 for each wafer and/or die size or a range of sizes.

The pick head 120 includes a variable receiving member 150 which slidably receives the column members 122 enabling the column members 122 to be interchangeable within the die head 120. In the preferred embodiment, the housing 130 includes an attachment section 132 having, for example, a tongue 134. Correspondingly, the variable receiving member 150 includes an connection section 152, such as, for example, a groove, for slidably receiving the tongue 134. Thus, column members 122 are easily interchangeable to vary the distance between adjacent vacuum ports 142 along the Y-axis to enable the same pick head 120 to be used to pick die 24 having varying sizes from the chuck 10. Clearly, the attachment section 132 and the connection section 152 may be coupled using other known methods, such as, for example, using a clamping mechanism, screws, or other fastening methods.

Figure 15:
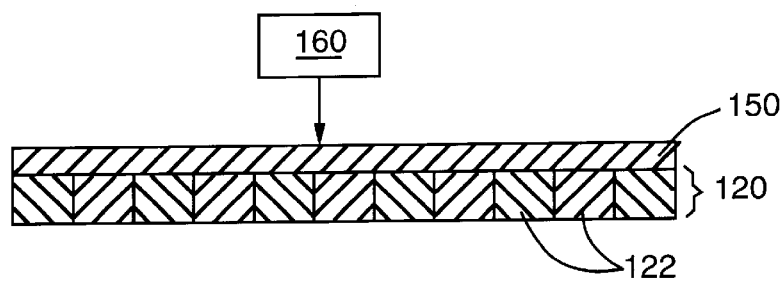
FIG. 15 is an embodiment of a die pick constructed in accordance with the present invention.

Referring to FIG. 15, in the second instance, the pick head 120 may be configured to accommodate different die 24 and wafer sizes along the X-axis. In particular, the variable member 150 is expandable and contractible along the X-axis. In the preferred embodiment, the variable member 150 is attached to repositioning member 160 which displaces each column member 122 along the X-axis a predetermined distance. For example, if the distance between the centers of adjacent die 24 along the X-axis is larger than that of the die previously picked by the die pick 100, then the repositioning member 160 separates the column members 122 such that the vacuum ports 142 in the base 130 of the column members 122 are aligned with the approximate center of each die 24. Alternatively, if the distance between adjacent centers of the die decreases along the X-axis, the repositioning member 160 contracts the relative positions of the column members 122 such that the vacuum ports 142 are aligned with the die 24 position on the chuck 10.

In the preferred embodiment, the repositioning member 160 is a programmable cam. Rotation of the cam causes the column members 122 to move relative to each other along the X-axis, i.e., the column members 122 either separate or move closer together. In particular, the cam is programmed such that at a base point on the cam, the column members 122 abut one another. As the cam is rotated, in a controlled, programmed manner, the column members 122 separate a predetermined distance. The separation of the column members 122 enables the same pick head 120 to be used with different sized wafers 14 and different sized die 24 as the pick head 120 can adjust to varying centerpoints of different sized die 24. Alternatively, the column members 122 may be connected to a control arm, or any other mechanism, which may be used to separate the column members 122 relative to one another.

In operation, the column members 122 are preferably oriented along the Y-axis such that when the die pick 100 picks the die 24 from the chuck 10, the center of each column member 122 corresponds to the longitudinal center of a column of die 24 along the Y-axis. The vacuum ports 142 are therefore also substantially aligned with the center of each die, which ensures that each vacuum port 142 makes absolute contact with the respective die 24 which facilitates the die pick 100 picking the die 24 from the chuck 10. When the wafer 14 and/or the die 24 size changes significantly, to accommodate picking die of variable sizes, the individual column members 122 may be removed from the die pick 100 and be replaced with column members 122 having either different sized vacuum ports 142 or a different orientation of the vacuum ports along the Y-axis. Additionally the column members 122 may be repositioned along the X-axis using the repositioning member 160.

Figure 16:
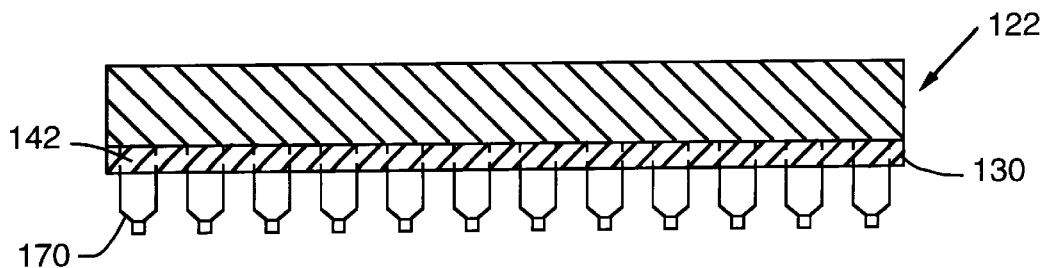
FIG. 16 is a side view of an embodiment of a component shown in FIG. 12 of a die pick constructed in accordance with the present invention.
Figure 17:
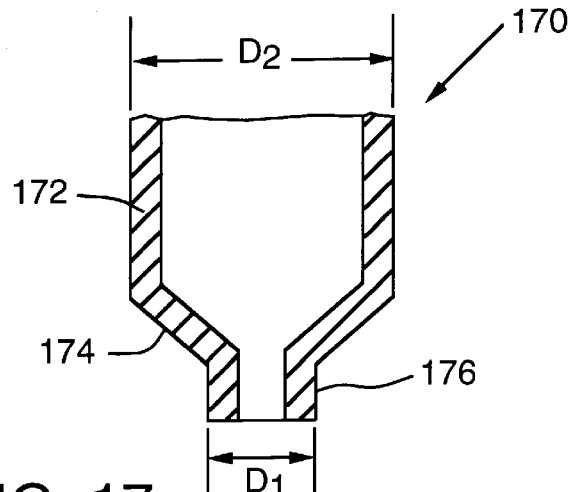
FIG. 17 is a cross-sectional view of a component shown in FIG. 1 of a die pick constructed in accordance with the present invention.

Referring as well to FIG. 16, the base 140 may include a plurality of nozzles 170 located at the exit side 143 of each vacuum port 142. Referring as well to FIG. 17, the nozzles 170 include cylindrical side wall 172 that preferably corresponds in both size and shape to the exit side of vacuum port 142. The cylindrical side wall 172 tapers to a head 174 which includes a nipple 176 formed therein. The shape of the nipple 176 is also preferably circular, however, alternative shapes of both the side wall 172 and the nipple 176 may be used. The outer diameter $D_1$ of the nipple 176 is preferably smaller than the outer diameter $D_2$ of the side wall 172 such that when the die pick 100 exerts a force on the die 24 during the pick operation, the nipple 176 is at least partially driven into the head 174, yet fluid flow from the nipple 176 to the vacuum chamber 132 is not obstructed. The size of the diameter $D_1$ of the nipple 176, as well as the pressure drop created by the vacuum source 170, may be varied, as is known in the art, to accommodate changes in the size of the die 24 that the die pick 100 picks from chuck 10.

Figure 18:
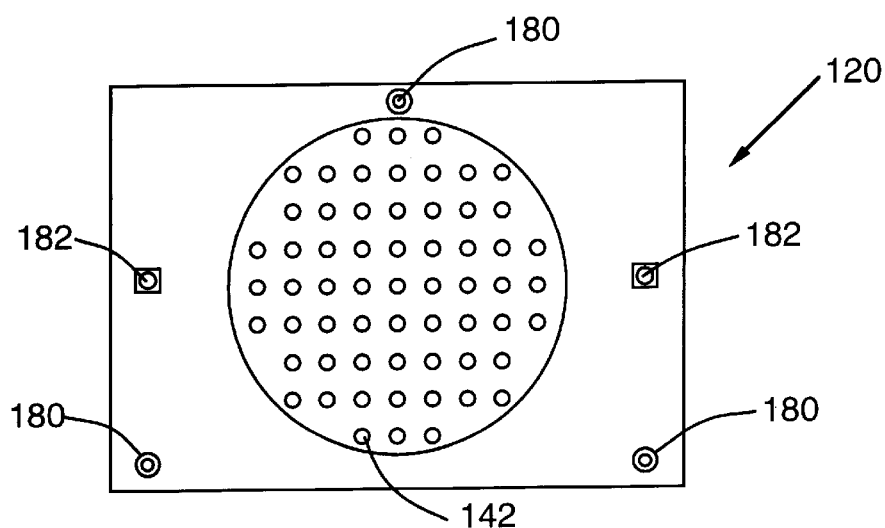
FIG. 18 is a bottom view of a die pick constructed in accordance with the present invention.

Referring to FIG. 18, the pick head 120 includes sensors 180 to ensure proper alignment of the pick head 120 with the chuck 10. In the preferred embodiment, the sensors 180, such as, for example, Freeka sensors, or any equivalent thereof, are positioned near the edge of the pick head 120 as shown. The chuck 10 correspondingly includes holes that are also located near the edge of the chuck 10. When the sensors 180 in the pick head 120 are aligned with the holes in the chuck 10, the pick head 120 is permitted to pick the die 24 from the chuck 10. Additionally, the pick head 120 may include a pressure sensor 182, such as for example, a standard piezoelectric device. The pressure sensor 182 ensures that there is adequate contact between the die pick 100 and the die 24 on chuck 10 to pick the die 24. When a predetermined force is detected by the sensor 182, a CPU interface directs the chuck 10 to initiate a vacuum puff off, i.e., to cease pulling a vacuum and create a slight pressure against the die 24 at vacuum port 68. Additionally, the CPU interface directs the die pick 100 to start pulling a vacuum so that the die 24 can be transferred from the chuck 10 to the die pick 100.

Figure 19:
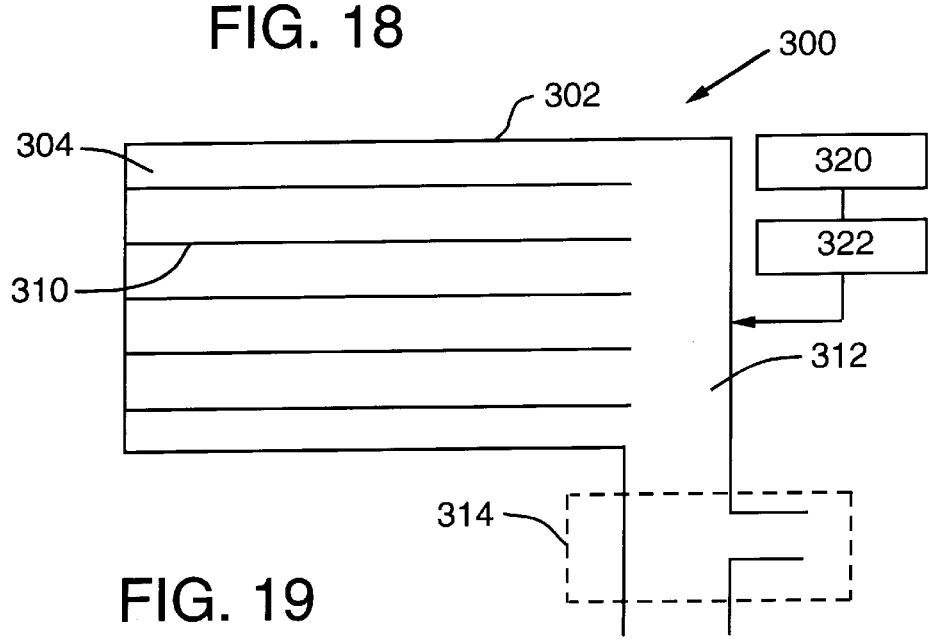
FIG. 19 is a plan view of a sorter constructed in accordance with the present invention.

Referring to FIG. 19, after the die 24 are picked from chuck 10, the die pick 100 places the die 24 on a sorter 300, which separates the functional die from the nonfunctional die. In particular, prior to the die pick 100 picking the die 24 from chuck 10, each individual die is tested using a testing unit. Alternatively, the die pick 100 may transport the die 24 to a testing unit for the testing operation. The testing unit determines whether each die is functional and whether the die 24 meet the specifications set for the chip. The information from the testing unit is stored in a memory device 320.

The memory device 320 signals a microprocessor 322 that is used with the sorter 300 to separate the functional die from the nonfunctional die. The sorter 300 includes a sorter tray 302 and a sorting device 314. The sorter tray 302 includes a number of continuous belt feed advance conveyors 304 driven by, for example a stepper motor having a counter wheel. The conveyors 304 may be separated by a plurality of partitions 310. The conveyors 304 feed into an end column 312 which feeds into the sorter device 314. The end column 312 is preferably a continuous belt conveyor, however, alternatively, the end column 312 may comprise a chute or any other means which can feed the die 24 into the sorter device 314.

In operation, the testing unit determines the location of all of the functional die that meet the product specifications. This information is stored by the memory device 320 that is used in conjunction with the sorter 300. After testing, the die pick 100 picks the die from the chuck 24 and the variable member 150 is extended by the repositioning member 160 to create gaps between the column members 122, and thus between the columns of die 24 engaged on the pick head 120. The die pick 100 then places the die 24 on the sorter tray 302 such that each column of die 24 on the pick head 120 corresponds to the location of a conveyor 304. As the die are transported out of the sorter tray 302 and on to the end column 312, the counter 308 moves the die 24 on each conveyor 304 in an organized, preprogrammed manner such that the microprocessor 322 keeps track of the location of each die 24 as they advance to the sorter device 314 for the sorting operation. At the sorter 314 device, the microprocessor 322, using the testing information stored by the memory device 320, directs the sorter device 314 to route functional die in one direction for further processing, such as, for example to process handling tubes for packaging or for feeding a framing machine to deposit the dies on frames, and directs the nonfunctional die in another direction for discarding. Different sized sorter trays 302 may be necessary to accommodate different sized dice 24. However, in the preferred embodiment, slight variations in the die size may be accommodated by altering the distance the repositioning member 160 separates the column members 122 of the pick head 120. Further, the sorter tray 302 can be sized to handle more than one wafer by, for example, lengthening the sorter section such that multiple die picks may feed the sorter. Clearly, such handling and sorting the die 24 on a per wafer basis, as opposed to the individual handling of each die, provides for a significant time savings.

The die pick 100 is preferably in a carousel arrangement with the chuck 10 and the testing 400 and sorter 300 systems. Thus, one die pick 100 can transport either a wafer 14 or the sawn die 24 from the chuck 10 to the testing unit 400 or to the sorter 300. Clearly, a number of testing units 400 and chucks 10 may be situated within this carousel arrangement to accommodate any differences in the processing time for each system. Additionally, the skilled artisan will appreciate the number of different arrangements of these systems which may be designed to best accommodate the processing of die 24.

Figure 20:
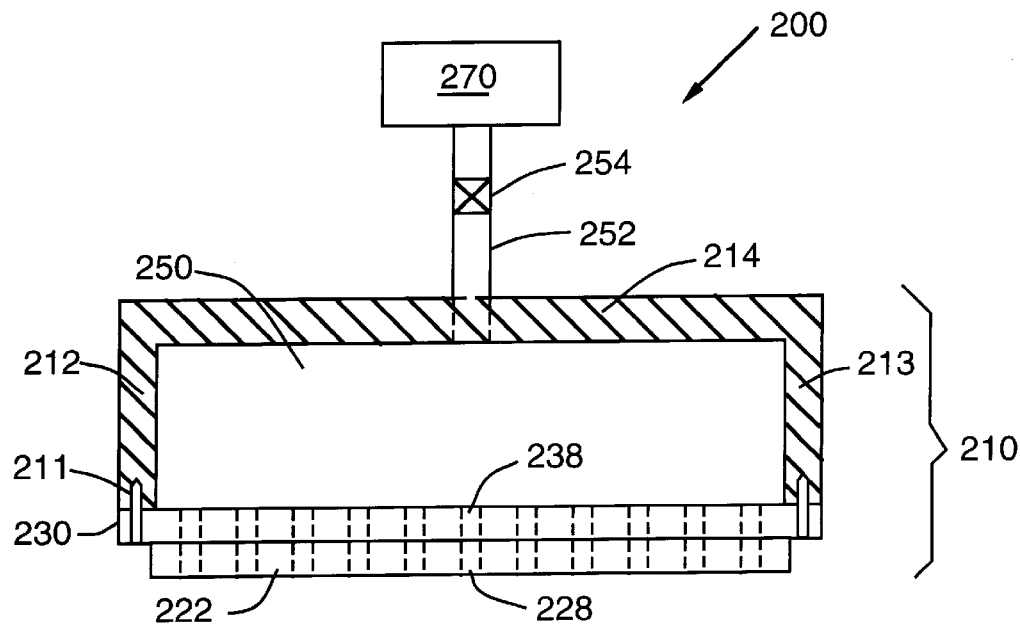
FIG. 20 is a cross-sectional view of an embodiment of a die pick constructed in accordance with the present invention.

Referring to FIG. 20, in an alternative embodiment, a die pick 200 includes a housing 210, a pick head 220, and a vacuum source 270, such as, for example, a vacuum pump. The housing 210 includes sides 212 and 213 and a top 214. The pick head 220 is attached to the sides 212 and 213 of the housing using, for example, screws 211. A vacuum chamber 250, defined by the housing 210 and the pick head 220, is connected to the vacuum source 270 through a passageway 252 having a check valve 254.

The pick head 220 includes a base 230 and a surface member 222. The base 230 is preferably made from a rigid material, such as, for example, stainless steel and the surface member 222 is preferably made from a resilient rubber, such as, for example, santoprene, that is fixedly attached to the base 230 by, for example, a fastener, such as screws, or by lamination. The surface member 222 and the base 230 include vacuum ports 228 and 238, respectively, which are preferably aligned with each other and are in fluid communication with the vacuum chamber 250. In this embodiment, to pick a range of sizes of wafers 14 an/or dies 24, a different pick head 220 must be attached to the housing 210 of the die pick 200. Each pick head 220 has a different configuration of vacuum ports 228 and 238 to correspond to different sized wafers 14 and/or due 24. Additionally, the size of the vacuum ports 228 and 238 may be increased or decreased depending upon the size of the die 24 to be picked. Alternatively, the vacuum ports 228 and 238 in pick head 220 may be densely configured, such that regardless of the individual die 24 size, or wafer 14 size, at least one vacuum port is located above each die 24. Thus, in this embodiment, a single pick head 220 may be used regardless of the size, die 24 or wafer 14 or at least one pick head 220 may be used for a range of die 24 or wafer 14 sizes. Additionally, nozzles, as described above, may be located at the exit side of the vacuum ports 228 and 238 to facilitate picking the die 24 from the chuck 10.

Figure 21:
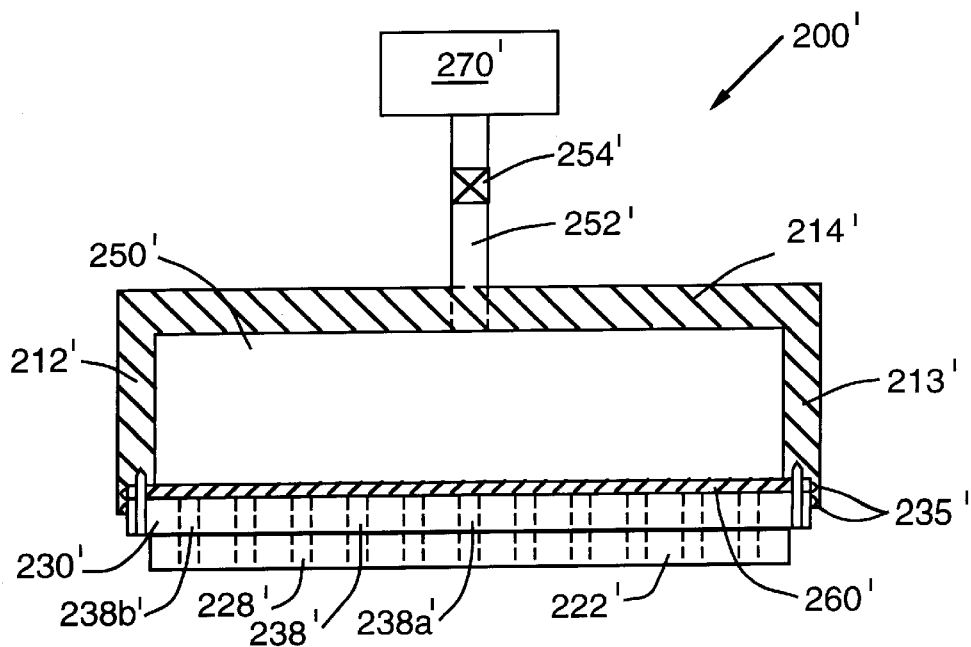
FIG. 21 is a cross-sectional view of an embodiment of a die pick constructed in accordance with the present invention.

Referring to FIG. 21, an embodiment of the die pick 200' includes a permeable layer 260 located between the vacuum chamber 250' and the base 230'. The permeable layer 260 is preferably formed of a ceramic, such as, for example, alumina, which is a standard material and has a generally uniform resistance to air flow. The permeable layer 260 provides even distribution of the vacuum pulled at vacuum ports 238' across the base 230'. The permeable layer 260 provides a resistance for the air flow as a vacuum is pulled such that the air flow through the vacuum ports 238' located in the center of base 230', e.g., vacuum port 238a, is approximately the same as the air flow through the vacuum ports 238' located near the edges of the base 230', e.g., vacuum port 238b'. The air flow resistance of the permeable layer 260 can be varied to achieve a desired pressure drop at the interface between the permeable layer 260 and the vacuum ports 238' by varying the pore size, the porosity, and/or permeability of the permeable layer 260.

The permeable layer 260 is mounted within the sides 212' and 213' of housing 210'. The base 230' is also at least partially located within housing 210'. Seals 235', such as O-ring seals, are located between the walls of the sides 212' and 213' of housing 210' and the permeable layer 260 and the base 230' to prevent leakage from between the permeable layer 260 and the base 230' and the wall of housing 210', which would adversely affect the vacuum pulled through vacuum ports 228' and 238'. The permeable layer 260 and the base 230' are preferably held in the housing 210' by, for example, easily accessible screws 211'.

In any of the above-mentioned embodiments, the vacuum ports are preferably circular in shape and are configured such that they are aligned with the center of each die on chuck 10 when the die pick picks the die 24 from the chuck 10. To enable the die pick to pick die 24 having variable sizes, the diameter of the vacuum ports and/or the vacuum pulled at each vacuum port may be varied, e.g., as the mass or size of the die 24 increases, the pressure drop and/or the diameter of vacuum ports must also increase.

Those with ordinary skill in the art will recognize that many modifications and variations of the present invention may be implemented. The foregoing description and the following claims are intended to cover all such modifications and variations.

What is claimed is:

1. A method for processing a wafer, comprising:
   providing a chuck having a surface, the surface having a plurality of recesses corresponding to street indices of the wafer;
   engaging a surface of the wafer directly against the surface of the chuck; and
   applying a negative pressure differential at the surface of the chuck.

2. The method of claim 1, further comprising cutting the wafer along a street index.

3. The method of claim 1, further comprising simultaneously cutting the wafer along a plurality of street indices.

4. The method of claim 1, further comprising simultaneously removing from the surface of the chuck a plurality of die cut from the wafer.

5. A method for processing a wafer, comprising:
   providing a chuck having a surface, the surface having a plurality of recesses corresponding to street indices of the wafer;
   engaging a surface of the wafer directly against the surface of the chuck; and
   applying a negative pressure differential at the surface of the chuck and to selected dice, wherein at least two but fewer than all dice cut from the wafer are selected.

6. The method of claim 5, further comprising simultaneously removing the selected dice from the chuck.

7. The method of claim 5, further comprising testing the dice.

8. The method of claim 5, further comprising sorting the dice.

9. A method for processing a wafer, comprising:
   providing a chuck having a surface the surface having a plurality of recesses corresponding to street indices of the wafer;
   engaging a surface of the wafer directly against the surface of the chuck;
   applying a negative pressure differential at the surface of the chuck;
   cutting the wafer along a street index;
   removing the wafer from the chuck;
   placing a surface of a second wafer against the surface of the chuck, the second wafer having street indices different from the street indices of the previous wafer, and the street indices of the second wafer corresponding to recesses of the chuck surface; and cutting the second wafer.

10. The method of claim 9, further comprising:

removing the second wafer from the chuck;

placing at least a third wafer, having street indices different from the street indices of the previous wafer and different from the street indices of the second wafer, against the surface of the chuck, wherein the street indices of the at least a third wafer correspond to recesses of the chuck; and cutting the at least a third wafer.

11. A method for processing a wafer, comprising:

providing a chuck having a surface, the surface having a plurality of recesses corresponding to street indices of the wafer;

engaging a surface of the wafer directly against the surface of the chuck;

applying a negative pressure differential at the surface of the chuck;

selecting at least two but fewer than all dies cut from the wafer for removal from the surface of the chuck; and simultaneously removing from the surface of the chuck said selected dies cut from the wafer.

12. The method of claim 11, further comprising testing the dice.

13. The method of claim 11, further comprising sorting the dice.

14. A method of processing a wafer having street indices, comprising:

providing a chuck having a surface, the surface having a plurality of recesses corresponding to the street indices of the wafer;

placing a surface of the wafer against the surface of the chuck;

applying a vacuum intermediate the wafer and the chuck;

moving a cutting assembly and the chuck relatively along at least one of the plurality of recesses to cut the wafer; and conducting debris through the recesses.

15. The method of claim 14, wherein the debris includes cuttings from the wafer.

16. The method of claim 15, further comprising applying liquid to the chuck to conduct the debris through the recesses.

17. The method of claim 16, wherein the liquid is a water solution.

18. The method of claim 16, wherein the liquid is water.

* * * * *